US008319109B2

(12) United States Patent
Ishii

(10) Patent No.: US 8,319,109 B2
(45) Date of Patent: Nov. 27, 2012

(54) ELECTRO-OPTICAL DEVICE AND ELECTRONIC APPARATUS

(75) Inventor: Kenya Ishii, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 283 days.

(21) Appl. No.: 12/389,755

(22) Filed: Feb. 20, 2009

(65) Prior Publication Data

US 2009/0250250 A1 Oct. 8, 2009

(30) Foreign Application Priority Data

Apr. 3, 2008 (JP) ................................ 2008-097377

(51) Int. Cl.

| | |
|---|---|
| ***H05K 1/00*** | (2006.01) |
| ***H05K 1/03*** | (2006.01) |
| ***H05K 1/16*** | (2006.01) |
| ***H05K 1/11*** | (2006.01) |
| ***H05K 7/00*** | (2006.01) |
| ***H05K 1/18*** | (2006.01) |
| ***G02C 5/00*** | (2006.01) |

(52) U.S. Cl. ........ 174/254; 174/255; 174/260; 174/268; 361/728; 361/748; 361/749; 349/149; 349/150

(58) Field of Classification Search ........................ None
See application file for complete search history.

(56) References Cited

U.S. PATENT DOCUMENTS

| | | | | |
|---|---|---|---|---|
| 5,528,403 | A * | 6/1996 | Kawaguchi et al. | 349/149 |
| 6,486,412 | B2 * | 11/2002 | Kato | 174/260 |
| 7,032,309 | B2 * | 4/2006 | Hirano | 29/854 |
| 7,061,567 | B2 * | 6/2006 | Murade | 349/151 |
| 7,164,460 | B2 * | 1/2007 | Hagiwara | 349/149 |
| 7,580,103 | B2 | 8/2009 | Kawaguchi | |
| 7,633,761 | B2 * | 12/2009 | Kim | 361/749 |
| 7,705,951 | B2 * | 4/2010 | Takenaka et al. | 349/150 |
| 2006/0060983 | A1 * | 3/2006 | Saito | 257/780 |

FOREIGN PATENT DOCUMENTS

| | | |
|---|---|---|
| JP | 05-173166 A | 7/1993 |
| JP | 06-043471 | 2/1994 |
| JP | 06-230728 A | 8/1994 |
| JP | 07-253591 A | 10/1995 |
| JP | 09-090392 A | 4/1997 |
| JP | 10-093210 A | 4/1998 |
| JP | 10-197841 A | 7/1998 |
| JP | 2001-119120 A | 4/2001 |
| JP | 2004-087940 | 3/2004 |
| JP | 2004-177578 | 6/2004 |
| JP | 2004-252331 A | 9/2004 |
| JP | 2005-292284 | 10/2005 |
| JP | 2005-292284 A | 10/2005 |
| JP | 2006-030727 | 2/2006 |
| JP | 2006-309135 A | 11/2006 |
| JP | 2007-132970 A | 5/2007 |
| JP | 2007-240808 | 9/2007 |

* cited by examiner

*Primary Examiner* — Jayprakash N Gandhi
*Assistant Examiner* — Dion Ferguson
(74) *Attorney, Agent, or Firm* — AdvantEdge Law Group, LLC

(57) ABSTRACT

An electro-optical device includes an electro-optical panel, a first wiring board and a second wiring board. The first wiring board having a one-side first connection terminal electrically connected to the panel-side connection terminal at one end of a first wiring forming surface and having an other-side first connection terminal at the other end of the first wiring forming surface. The second wiring board having one-side second connection terminal electrically connected to the other-side first connection terminal at one end of a second wiring forming surface and having the other-side second connection terminal at the other end of the second wiring forming surface.

13 Claims, 10 Drawing Sheets

100
300 200 210
400b
400e 1
100
400
300
200w
210

1
100
400
300
200w
210w 1100
1114
1112
1104
1102
1106
1106
1106
1106
R
G
B
1110R
1110G
1110B
1108

ELECTRO-OPTICAL DEVICE AND ELECTRONIC APPARATUS

BACKGROUND

1. Technical Field

The present invention relates to an electro-optical panel such as a liquid crystal panel or the like, an electro-optical device formed by connecting a chip on film (COF) or a flexible printed circuit (FPC), such as a liquid crystal device or the like, an electronic apparatus including the electro-optical device, such as a liquid crystal projector or the like.

2. Related Art

In this type of electro-optical device, a wiring board such as a COF, a FPC, a printed circuit board (PCB), a printed wiring board, a tape carrier package (TCP) or the like is connected to an external circuit connection terminal of an electro-optical panel.

Such a connection is performed by compression bond or thermal compression bond. At this time, in order to applying uniform pressure so as to eliminate a connection failure, a technique of connecting two COF-mounted wiring boards in series is suggested (see JP-A-2004-87940). A COF-mounted FPC is first connected to an electro-optical panel and a COF-mounted PCB is then connected to the FPC.

Meanwhile, in such an electro-optical device, in order to achieve high precision of a display and fineness of a pixel, a technique of connecting a TCP, in which connection terminals, electrodes and wirings are formed on both surfaces thereof, to a display panel and then connecting a printed wiring board to the TCP is suggested (see JP-A-2004-177578).

However, according to the technique disclosed in JP-A-2004-87940, since two COFs are used, handling is extremely difficult at the time of mounting. In more detail, the COFs are susceptible to be damaged due to bending at the time of mounting. In addition, in the connection of an end opposite to that connected to the electro-optical panel in the COF, affinity to a connector is poor (in other words, the COF is hard to be connected or is hard to be connected without damage).

Meanwhile, according to the technique disclosed in JP-A-2004-177578, the connection terminals, the electrodes and the wirings need to be provided on both surfaces of the TCP and the structure of the device is basically complicated. In addition, since a special TCP and a printed wiring board are connected in series, the handling at the time of mounting is extremely difficult. In particular, at the time of mounting the special TCP is susceptible to be damaged due to bending.

SUMMARY

An advantage of some aspects of the invention is that it provides an electro-optical device capable of increasing the strength of a wiring board or a connection place and improving handling of the whole device at the time of external connection or mounting while a relatively simple configuration is employed, and an electronic apparatus including the electro-optical device.

According to an aspect of the invention, there is provided an electro-optical device including: an electro-optical panel performing an electro-optical operation and having a panel-side connection terminal for inputting/outputting a signal for the electro-optical operation on a substrate; a first wiring board having one-side first connection terminal electrically connected to the panel-side connection terminal at one end of a first wiring forming surface, on which wirings are formed, and having the other-side first connection terminal at the other end of the first wiring forming surface; and a second wiring board having one-side second connection terminal electrically connected to the other-side first connection terminal at one end of a second wiring forming surface, on which wirings are formed, and having the other-side second connection terminal at the other end of the second wiring forming surface.

According to the electro-optical device of the invention, at the time of the operation, for examples, signals such as power signals, data signals and control signals are input from the external device to the electro-optical panel via the second wiring board, the first wiring board, and the panel-side connection terminal such as the external circuit connection terminal. The "external device" is, for example, a data signal source, a data signal processing circuit, a control signal generating circuit or a power circuit.

On the second wiring board, various types of signals are input from the external device via the plurality of other-side second connection terminals connected to the external device and located far from the electro-optical panel. Further, various types of signals are output from the plurality of one-side second connection terminals to the first wiring board via the wirings connected to the plurality of other-side second connection terminals. At this time, the second wiring board is, for example, a simple non-FPC-mounted or non-COF-mounted flexible board.

Then, on the first wiring board, various types of signals are input via the plurality of other-side first connection terminals located far from the electro-optical panel and connected to the plurality of one-side second connection terminals of the second wiring board. Further, various types of signals are output from the plurality of one-side first connection terminals to the electro-optical panel via the wirings connected to the plurality of other-side first connection terminals. At this time, the first wiring board is, for example, a COF, a COF-mounted flexible board, or a non-COF-mounted flexible board. That is, on the first wiring board, at least a portion of signal processing for the electro-optical operation (for example, a serial-parallel conversion or the like) is performed.

By the input/output of the various types of signals, in the electro-optical panel, for example, an electro-optical operation such as a transmissive or reflective liquid crystal display, an electroluminescence (EL) display, a plasma display or the like is performed. At this time, the driving circuit may be built in the electro-optical panel and may be at least partially mounted on the first wiring board in a COF mounting form. In addition, the driving circuit may be at least partially mounted on the first wiring board in a COF mounting form.

In the invention, in particular, the first wiring board is connected to the electro-optical panel. Typically, the first wiring board is connected to the electro-optical panel such that the first wiring forming surface thereof faces the surface of the substrate. That is, if the surface of the substrate (for example, the surface of the device substrate or the TFT array substrate on which devices, wirings, electrodes and so on are formed) of the electro-optical panel faces upward, the first wiring board is connected such that the first wiring forming surface faces downward. In this case, for example, if the first wiring board is a COF-mounted flexible board, the COF type integrated circuit is mounted so as to face downward, that is, reversely.

Further, the second wiring board is connected to the first wiring board. Typically, the second wiring board is connected to the first wiring board such that the second wiring forming surface faces the first wiring forming surface. That is, if the surface of the substrate of the electro-optical panel faces upward, the second wiring substrate is connected such that the second wiring forming surface thereof faces upward. In this case, for example, if the second wiring board is a non-COF-mounted flexible board, the wiring forming surface faces upward and the other-side second connection terminals located at the other end face upward.

In addition, the mutual electrical connection between the panel-side connection terminal and the one-side first connection terminals of the first wiring board and between the other-side first connection terminals of the first wiring board and the one-side second connection terminals of the second wiring board is realized by interposing, for example, an anisotropic conductive film (ACF). Further, the connection between the external device and the other-side second connection terminals of the second wiring board corresponding to the input/output terminal of the external device in the whole electro-optical device is realized by high-versatility connector connection.

According to the invention, the direction (that is, the vertical direction on the surface of the substrate) based on the surface of the substrate of the electro-optical panel of the other-side second connection terminals of the second wiring board corresponding to the input/output terminal of the external device is equal to the direction of the panel-side connection terminal of the electro-optical panel. Accordingly, the other-side second connection terminals of the second wiring board corresponding to the input/output terminal of the external device in the whole electro-optical device may use a high-versatility "lower contact connector". In other words, with respect to the direction of the input/output terminal of the external device in the whole electro-optical device, a connection environment with high reliability can be easily obtained by the direct connection of the lower contact connector to the panel-side connection terminal.

In addition, according to the invention, the electro-optical device is connected to the external device by the handling of the second wiring substrate having the other-side second connection terminals corresponding to the input/output terminal of the external device, that is, located far from the electro-optical panel. Accordingly, the first wiring board has a configuration which is hard to be handled at the time of connection, and the second wiring board has a configuration which is susceptible to be handled at the time of connection. Thus, a configuration which is susceptible to be handled can be wholly obtained.

For example, a COF-mounted flexible board which is susceptible to be damaged at the time of connection or mounting and has high cost may be used as the first wiring board and a non-COF-mounted flexible board which is hard to be damaged at the time of connection or mounting and has low cost may be used as the second wiring board. Accordingly, the advanced signal processing function is performed by the first wiring board and the handling at the time of mounting of the whole electro-optical device is efficiently improved.

In particular, with respect to the first wiring board directly connected to the electro-optical panel, a thin single-layer base material may be suitably used in order to avoid the breaking due to a difference in thermal expansion coefficient with the device substrate or the TFT array substrate configuring the electro-optical panel (for example, the stripping of the connection place between the first connection terminals of the first wiring board and the panel-side connection terminal due to compression bond). In contrast, with respect to the second wiring board, a hard multi-layer base material is suitably used. Accordingly, by using two wiring boards, the sharing of roles of the side close to the electro-optical panel and the side close to the external circuit is practically advantageous while the connection to the lower contact connector is possible.

As described above, it is possible to increase the strength of the connection place or the wiring board, improve a whole handling property at the time of connection with the external device or mounting, and improve yield, while a relatively simple configuration is employed.

In the aspect of the electro-optical device of the invention, the first wiring board may be mounted on the first wiring forming surface, and may have an integrated circuit of which an output side is electrically connected to the one-side first connection terminal and an input side is electrically connected to the other-side first connection terminal.

By this aspect, the first wiring board has, for example, a COF-mounted integrated circuit on the first wiring forming surface, that is, the same surface as the surface on which the wirings, and the one-side and other-side first terminals are formed. Accordingly, by providing the integrated circuit on the first wiring board close to the electro-optical panel instead of the second wiring board having the other-side second connection terminals corresponding to the input/output terminal of the external device, performing the signal processing function by the first wiring board, and using the non-COF-mounted flexible board which is hard to be damaged at the time of connection or mounting and has low cost as the second wiring board, the whole handling property at the time of the connection with the external device or mounting is improved.

In this aspect, an arrangement pitch of the one-side first connection terminal may be smaller than that of the other-side first connection terminal.

By this configuration, in a state in which the integrated circuit is centered, the terminal pitch of the side close to the electro-optical panel may be smaller and the terminal pitch of the side far from the electro-optical panel may be larger. Accordingly, it is possible to cope with the relative large wiring pitch and terminal pitch of the second wiring board side having relatively low cost while corresponding to the fineness of the pixel pitch of the electro-optical panel, the wiring pitch corresponding thereto, the terminal pitch, etc. At this time, if the signal processing is performed by the integrated circuit as the number of signals output from the integrated circuit becomes larger than that of signals input to the integrated circuit, it is advantageous in the relationship with the arrangement pitch.

In the aspect in which the first wiring board has the integrated circuit, the integrated circuit may serial-parallel convert a serial image signal input via the other-side first connection terminal and output a parallel image signal via the one-side first connection terminal.

By this configuration, the number of signals output from the integrated circuit is significantly larger than that of signals input to the integrated circuit by the serial-parallel conversion or the development number (in other words, the phase development number). At this time, the integrated circuit is provided on the first wiring board close to the electro-optical panel. Accordingly, if the second wiring board transmits the serial image signals, that is, a smaller number of various signals, while the first wiring board performs the serial-parallel converting function, a flexible board having a large wiring pitch or terminal pitch and low cost can be used. Accordingly, it is wholly possible to establish an electro-optical device which is susceptible to be connected or mounted with low cost.

The first wiring board may be a flexible board in which the integrated circuit is COF-mounted, and the second wiring board may be a flexible board in which the integrated circuit is not COF-mounted.

By this configuration, the electro-optical device is connected to the external device by the handling of the hard second wiring substrate which is the simple FPC or non-COF-mounted flexible board. Accordingly, although the first wiring board is the COF or the COF-mounted flexible board which is hard to be handled at the time of connection, a configuration which is susceptible to be handled at the time of connection or mounting can be wholly obtained.

In the aspect in which the first wiring board has the integrated circuit, a long side of the integrated circuit may be located on the first wiring forming surface in plan view along a width direction of the first wiring board, the first wiring board may be locally widely formed in a portion in which the integrated circuit is mounted, and wirings formed in the first wiring forming surface may include wirings which are formed so as to detour the integrated circuit.

By this configuration, it is possible to mount a relatively large integrated circuit while the increase of the width of the connection portion between the first wiring board and the electro-optical panel and the width of the connection portion between the first wiring board and the second wiring board is reduced or suppressed. In addition, by detouring the wirings which do not need to pass through the inside of the integrated circuit on the first wiring forming surface around the integrated circuit, the wiring can be wired from the side far from the electro-optical panel of the integrated circuit to the side close to the electro-optical panel without causing a problem.

In another aspect of the electro-optical device of the invention, the width of one end of the first wiring board may be narrower than that of the other end thereof.

According to this aspect, the connection between the small-sized electro-optical panel and the large-sized connector can be realized by the first and second wiring boards. That is, it is remarkably easy to cope with the fine pitch of the electro-optical panel side and cope with the relatively wide pitch of the external connector. In particular, by utilizing a thin base material which is hardly influenced by the thermal expansion as the first wiring board, it is possible to improve the reliability of the electrical connection at a narrow pitch of the electro-optical panel side. Simultaneously, by utilizing a hard base material as the second wiring board, it is possible to improve the handling property of the electrical connection while coping with the wide pitch of the external side via the second wiring board. At this time, since the lower contact connector can be used in the external connection, it is practically advantageous.

In addition, with respect to the second wiring board, the width of one end thereof may be narrower than or equal to that of the other end thereof. If the second wiring board is configured such that the width of one end thereof is narrower than that of the other end thereof, it is possible to improve the handling property of the electrical connection while coping with the wide pitch of the external side.

The electro-optical device may further include a plate-shaped reinforcement member which is mounted or fixed to the electro-optical panel, is mounted on the back surface located at the back of the first wiring forming surface of the first wiring board, and reinforces the first wiring board from the back surface.

According to this aspect, the plate-shape reinforcement member is directly or indirectly mounted or fixed to the electro-optical panel and is mounted on the back surface of the first wiring board. The term "indirectly mounted or fixed" described herein indicates that, for example, the reinforcement member is further mounted or fixed on another portion of the electro-optical device, which is mounted or fixed to the electro-optical panel, such as a case for containing the electro-optical panel or a fixing member. Accordingly, it is possible to improve the mechanical or physical strength of the first wiring board by the reinforcement of the first wiring board from the back side thereof on the basis of the electro-optical panel by the reinforcement member. Accordingly, although a base material with low mechanical or physical strength is used as the first wiring board or the integrated circuit which is susceptible to be damaged on the first wiring forming surface is established, it is possible to reduce a probability that damage occurs at the time of connection or mounting.

In this aspect, the reinforcement member may include a plate-shaped portion obtained by extending a portion of a case for containing the electro-optical panel toward the second wiring board.

By this configuration, the first wiring board can be hard reinforced from the back side thereof by the plate-shape portion obtained by extending the portion of the case, such as a metal frame portion of the case, of the reinforcement member. Accordingly, although a board which does not mostly have mechanical or physical strength can be employed as the first wiring board, practical convenience can be obtained. If the portion of the case extends, the configuration of the device and the manufacturing do not become complicated.

In this case, the reinforcement member may extend to a position facing the second wiring forming surface.

By this configuration, the first wiring board can be reinforced over the whole area of the longitudinal direction from the electro-optical panel side to the second wiring board side. In addition, the connection place between the other-side first connection terminals of the first wiring board and the one-side second connection terminals of the second wiring board can be reinforced from the back side of the first wiring board (that is, the second wiring forming surface side of the second wiring board), and the mechanical or physical strength of the connection place can be remarkably improved by the reinforcement member. That is, both the connection places located at both ends of the first wiring board can be reinforced by the reinforcement member. Further, it is advantageous that the whole area of the first wiring board and a part or the whole area of the second wiring board can be covered by one reinforcement member.

In addition, the reinforcement member does not need to extend along the second wiring board and may basically extend to the vicinity of the connection place between the first and second wiring boards. In contrast, if the reinforcement member extends to the whole area of the second wiring board, it may become a hindrance to mounting. Accordingly, it is preferable that the reinforcement member extends to the vicinity of the connection place.

In this case, the reinforcement member may be adhered to the second wiring forming surface.

By this configuration, by the adhesion between the reinforcement member and the second wiring board, it is possible to remarkably improve the reinforcement of the adhesion place between the first and second wiring boards (that is, the connection place between the other-side first connection terminals of the first wiring board and the one-side second connection terminals of the second wiring board) Accordingly, it is possible to efficiently prevent the stripping of the connection place at the time of connection or mounting.

According to another aspect of the invention, there is provided an electronic apparatus comprising the above-described electro-optical device (including the various aspects).

Since the electronic apparatus of the invention includes the electro-optical device of the invention, various types of electronic apparatuses capable of performing a high-quality image display, such as a projection type display device, a television set, a cellular phone, an electronic organizer, a word processor, a viewfinder-type or direct-view monitor type video tape recorder, a workstation, a videophone, a POS terminal, a touch panel and so on can be realized. As an electronic apparatus of the invention, for example, an electrophoretic apparatus such as an electronic paper, an electron emission apparatus (a field emission display and a conduction electron-emitter display), and a display apparatus including the electrophoretic apparatus and the electron emission apparatus can be realized.

The operation and other advantages the invention may become apparent from the following detailed description of the invention.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, an electro-optical device and an electronic apparatus according to the embodiments of the invention will be described with reference to the accompanying drawings. In addition, in the present embodiments, a thin-film-transistor (TFT) active matrix driving type liquid crystal device will be described as an example of the electro-optical device.

First Embodiment

A first embodiment of the invention will be described with reference to FIGS. 1 to 5.

Figure 1:
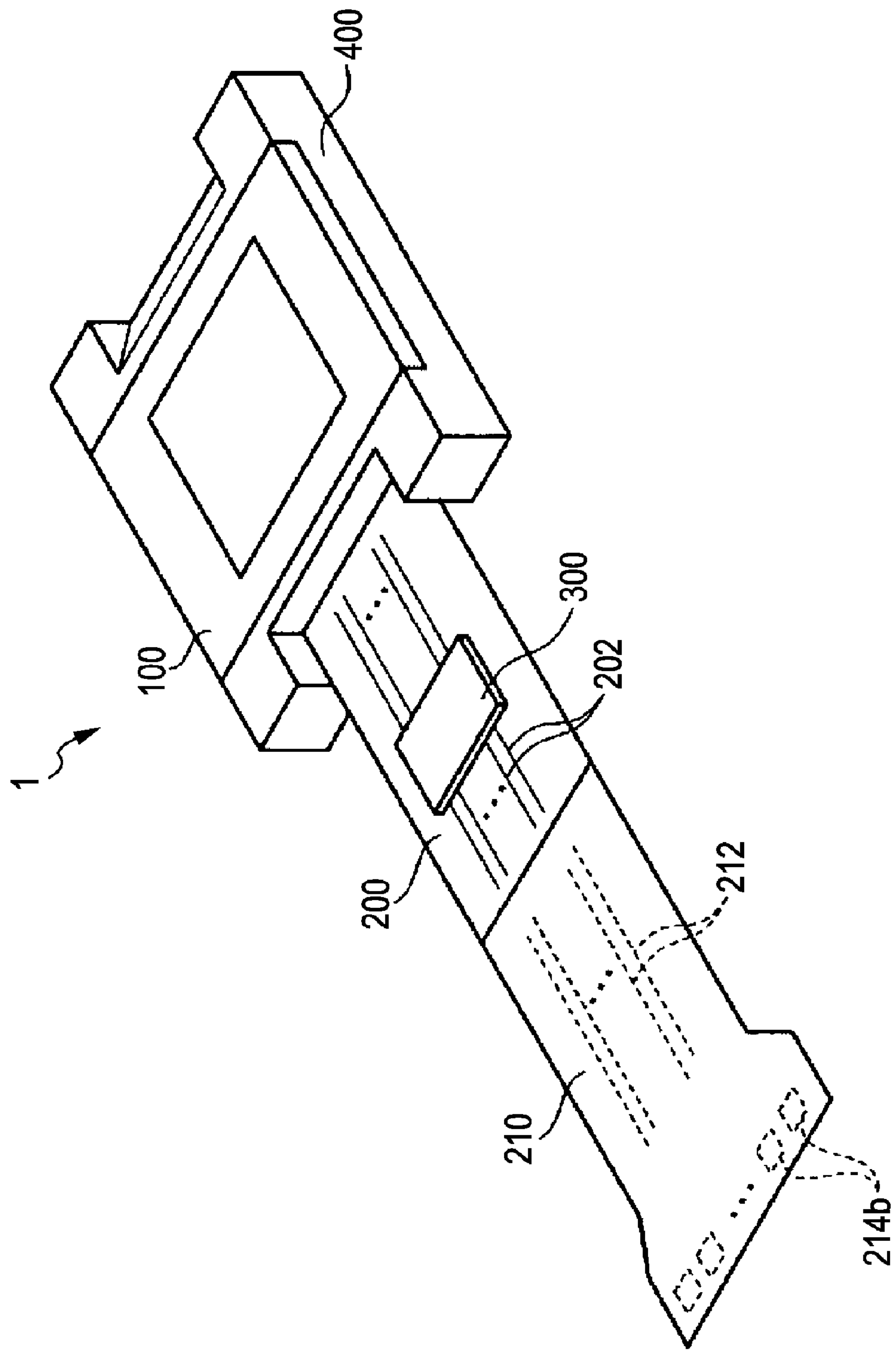
FIG. 1 is a perspective view of a liquid crystal device according to a first embodiment of the invention.

First, the whole configuration of the liquid crystal device according to the present embodiment will be described with reference to FIG. 1. FIG. 1 is a perspective view of the liquid crystal device according to the present embodiment.

In FIG. 1, the liquid crystal device 1 according to the present embodiment includes a liquid crystal panel 100, a first wiring board 200, a second wiring board 210, and a case 400. The "liquid crystal panel 100" according to the present embodiment is an example of an "electro-optical panel" according to the invention. In addition, the "liquid crystal device 1" according to the present embodiment is an example of an "electro-optical device" according to the invention.

The first wiring board 200 is a flexible board in which a driving IC chip 300 is mounted in a COF mounting form. In the first wiring board 200, a plurality of wirings 202 is formed on a surface facing upward in FIG. 1, which is an example of a "first wiring forming surface" of the invention. In addition, first connection terminals are equally formed on the surface facing upward in FIG. 1 at ends of the plurality of wirings 202 in both ends of the first wiring board 200. The first connection terminals are not shown in FIG. 1 and will be described in detail later.

The second wiring board 210 is a flexible board on which IC chips or the like are not mounted. In the second wiring board 210, a plurality of wirings 212 is formed on a surface facing downward (that is, a back surface which is not shown in FIG. 1) in FIG. 1, which is an example of a "second wiring forming surface" of the invention. In addition, second connection terminals are equally formed on the surface facing downward in FIG. 1 at ends of the plurality of wirings 212 in both ends of the second wiring board 210. Portions of the second connection terminals, which are connected to external connectors, are shown as the second connection terminals 214*b* in FIG. 1 and thus the second connection terminals of the side of the first wiring board 200 are not shown in FIG. 1. Such second connection terminals will be described in detail later.

The driving IC chip 300 includes, for example, a portion (for example, a serial-parallel converting circuit) of a data linear driving circuit (not shown) and is electrically and mechanically adhered to the first wiring board 200 in the COF mounting form using a tape automated bonding (TAB) technique.

Figure 2:
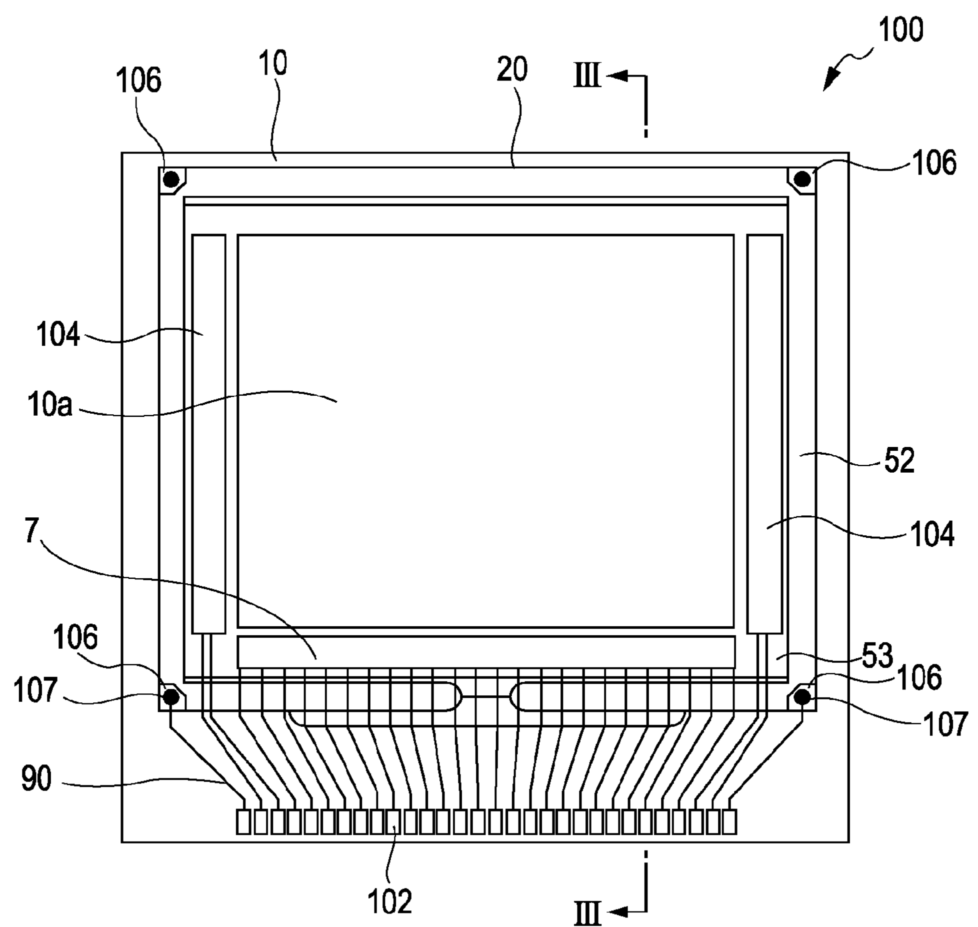
FIG. 2 is a plan view showing the whole configuration of a liquid crystal panel according to the first embodiment.

Next, the liquid crystal panel 100 will be described with reference to FIGS. 2 and 3. FIG. 2 is a plan view of a TFT array substrate together with components formed thereon when viewed from a counter substrate side, and FIG. 3 is a cross-sectional view taken along line III-III of FIG. 2.

Figure 3:
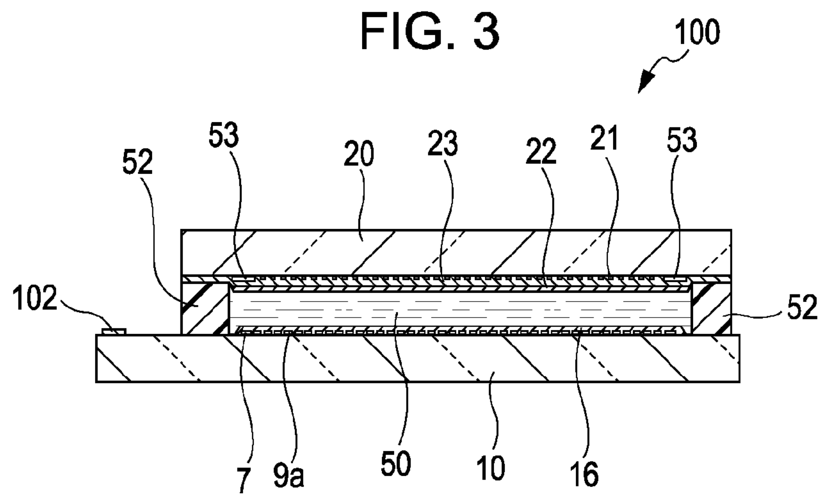
FIG. 3 is a cross-sectional view taken along line III-III of FIG. 2.

In FIGS. 2 and 3, in the liquid crystal panel 100 of the present embodiment, the TFT array substrate 10 and the counter substrate 20 face each other. The TFT array substrate 10 is, for example, formed of a transparent board such as a quartz board or a glass board, or a silicon board. The counter substrate 20 is, for example, formed of a transparent board such as a quartz board or a glass board. A liquid crystal layer 50 is filled between the TFT array substrate 10 and the counter substrate 20, and the TFT array substrate 10 and the counter substrate 20 are adhered to each other by a sealing material 52 provided in a sealing area located at the periphery of an image display area 10*a* which corresponds to an area, in which a plurality of pixels is provided, as an example of a "pixel area" of the invention.

The sealing material 52 is, for example, formed of ultraviolet curing resin, thermosetting resin or ultraviolet-curing and thermosetting resin for adhering both boards, is coated on the TFT array substrate 10 in a manufacturing process and then is cured by irradiation of ultraviolet rays or heating. In the sealing material 52, gap materials for maintaining an interval (that is, a gap) between the TFT array substrate 10 and the counter substrate 20 at a predetermined value, such as glass fiber or glass beads, are dispersed. In addition, the gap materials may be arranged in an image display area 10*a* or a peripheral area located at the periphery of the image display area 10*a*, in addition to or instead of the mixture of the gap materials into the sealing material 52.

In FIG. 2, a frame light-shielding film 53 defining a frame area of the image display area 10*a* is provided at the side of the counter substrate 20 in parallel to the inside of the sealing area in which the sealing material 52 is arranged. A part or all of the frame light-shielding film 53 may be provided at the side of the TFT array substrate 10 as a built-in light-shielding film.

In an area located outside the sealing area, in which the sealing material 52 is arranged, of the peripheral area, an external circuit connection terminal 102 which is an example of a "panel-side connection terminal" of the invention is provided along one side of the TFT array substrate 10. A sampling circuit 7 is provided inside the sealing area along one side so as to cover the frame light-shielding film 53. A scan line driving circuit 104 is provided inside the sealing area along two sides adjacent to one side so as to cover the frame light-shielding film 53.

On the TFT array substrate 10, vertical conducting terminals 106 for connecting both boards by a vertical conducting material 107 are arranged in areas facing four corners of the counter substrate 20. By these terminals, the TFT array substrate 10 and the counter substrate 20 are electrically conducted. In addition, a drawing wiring 90 for electrically connecting the external circuit connection terminal 102, the scan line driving circuit 104 and the vertical conducting terminal 106 is formed.

In FIG. 3, a lamination structure including wirings such as scan lines and data lines or pixel switching TFTs which are driving elements is formed on the TFT array substrate 10. The detailed configuration of this lamination structure is not shown in FIG. 3, but pixel electrodes 9*a* formed of a transparent material such as indium tin oxide (ITO) are formed in every pixel in an island shape with a predetermined pattern on the lamination structure.

The pixel electrodes 9*a* are formed in the image display area 10*a* on the TFT array substrate 10 so as to be opposite to counter electrodes 21. An alignment film 16 is formed on the surface of the TFT array substrate 10 facing the liquid crystal layer 50, that is, on the pixel electrodes 9*a*, so as to cover the pixel electrode 9*a*.

A light-shielding film 23 is formed on the surface of the counter substrate 20 opposite to the TFT array substrate 10. The light-shielding film 23 is, for example, formed on the counter surface of the counter substrate 20 in a lattice shape in plan view. In the counter substrate 20, a non-opening area is defined by the light-shielding film 23 and an area partitioned by the light-shielding film 23 becomes an opening area for transmitting light emitted from, for example, a direct-view backlight or a projector lamp. In addition, the light-shielding film 23 may be formed in a stripe shape, and the non-opening area may be defined by various components such as the data lines provided on the TFT array substrate 10 and the light-shielding film 23.

On the light-shielding film 23, the counter electrodes 21 formed of a transparent material such as ITO are formed so as to be opposite to the plurality of pixel electrodes 9*a*. On the light-shielding film 23, in order to achieve a color display in the image display area 10*a*, color filters which are not shown in FIG. 3 may be formed in an area including the opening area and a part of the non-opening area. An alignment film 22 is formed on the counter electrodes 21 on the counter surface of the counter substrate 20.

In addition, on the TFT array substrate 10 shown in FIGS. 2 and 3, a precharge circuit for supplying a precharge signal having a predetermined voltage level to the plurality of data lines prior to an image signal or a test circuit for testing quality and defect of the liquid crystal device during manufacturing or before shipment may be formed, in addition to the scan line driving circuit 104 and the sampling circuit 7.

Figure 4:
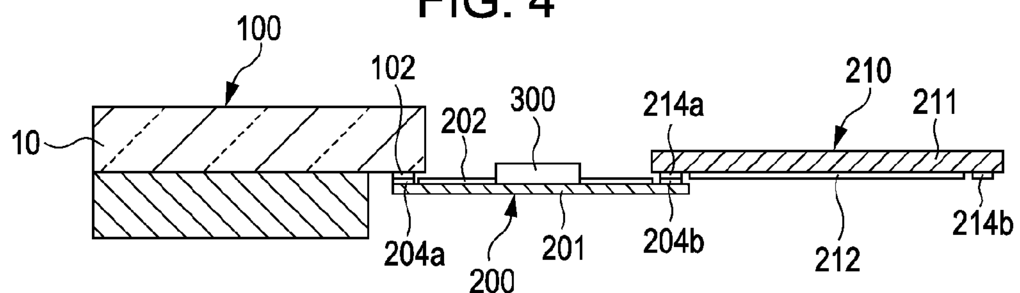
FIG. 4 is a schematic cross-sectional view of the liquid crystal device according to the first embodiment.
Figure 5:
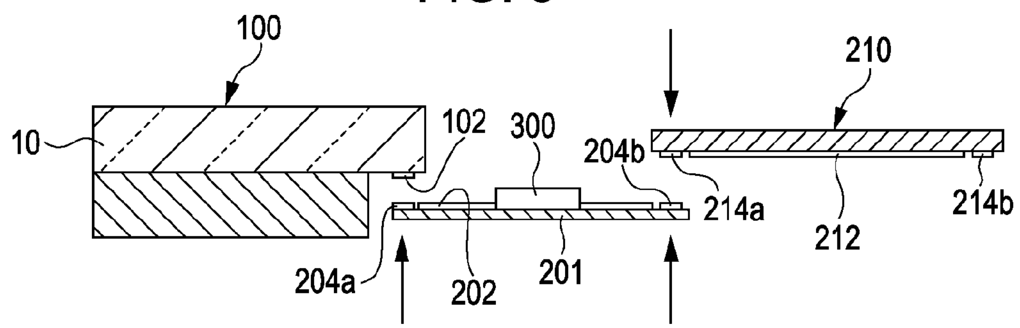
FIG. 5 is a schematic cross-sectional view showing a state in which first and second wiring boards are connected, in the liquid crystal device according to the first embodiment.
Figure 6:
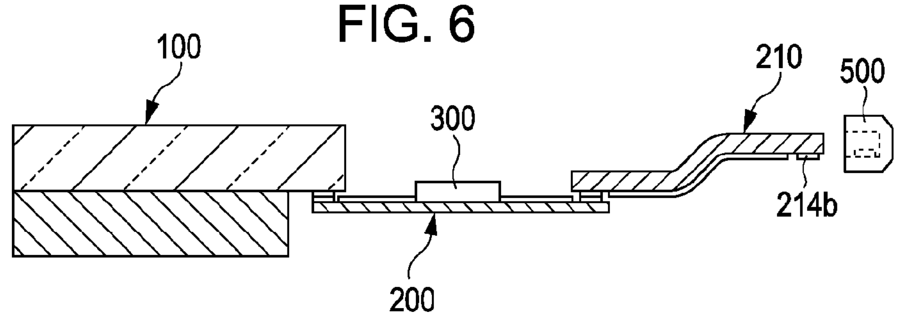
FIG. 6 is a schematic cross-sectional view showing a state in which a lower contact connector is connected, in the liquid crystal device according to the first embodiment.
Figure 7:
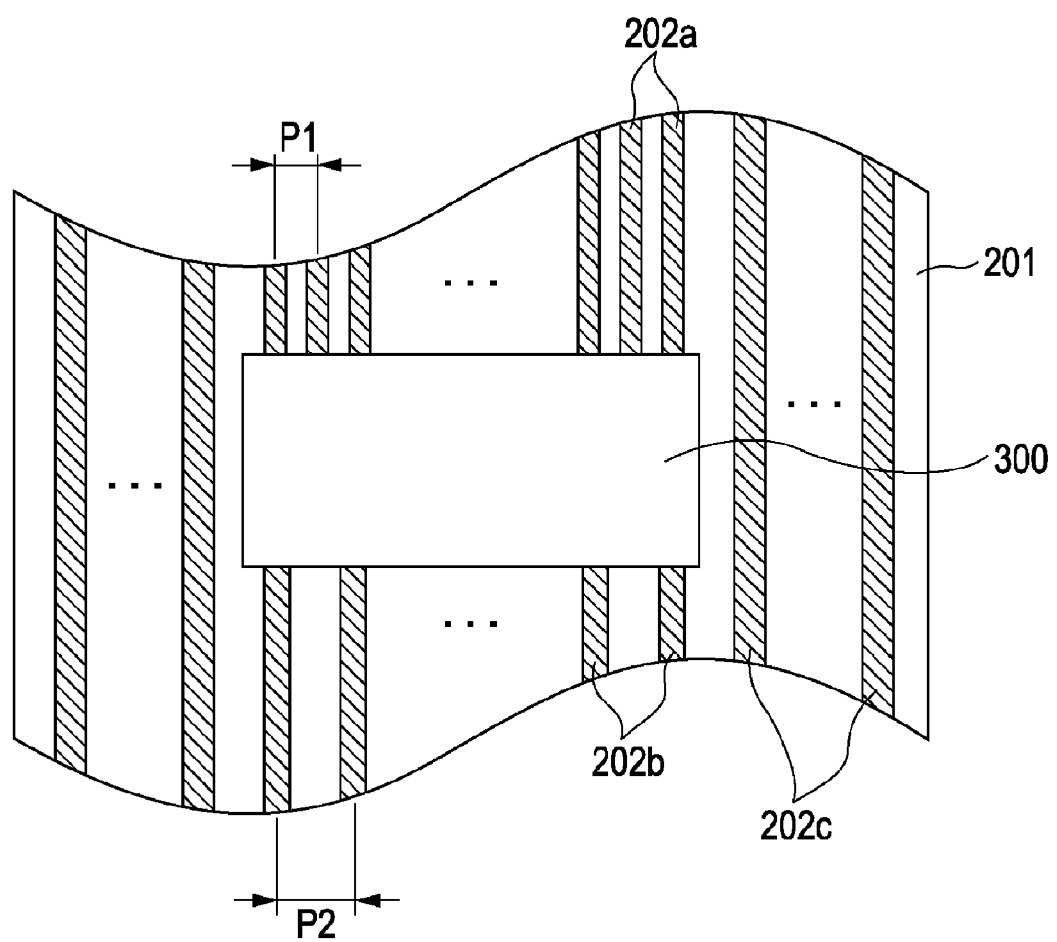
FIG. 7 is a plan view of a first wiring board used in a second embodiment of the invention in the vicinity of a COF-mounted place.

Next, the configuration and the effect of the first wiring board 200 and the second wiring board 210 will be described in detail with reference to FIGS. 4 to 7 in addition to FIG. 1. FIG. 4 is a schematic cross-sectional view of the liquid crystal device shown in FIG. 1 taken along a direction in which the first and second wiring boards extend. FIG. 5 shows a state in which the first and second wiring boards are connected, and FIG. 6 shows a connection state with an external connector. FIG. 7 is a plan view of the first wiring board in the vicinity of a COF-mounted place.

As shown in FIGS. 1, 4 and 5, the first wiring board 200 is obtained by forming the plurality of wirings 202 on the upper surface of a flexible film 201. At front ends (that is, the left ends in FIGS. 4 and 5) of the plurality of wirings 202 of the side of the liquid crystal panel 100, a plurality of first connection terminals 204*a* is formed on the upper surface of the same flexible film 201. The first connection terminals 204*a* are an example of "one-side first connection terminal" of the invention and are electrically connected to the external circuit connection terminal 102 via, for example, an ACF (not shown). At front ends (that is, the right ends in FIGS. 4 and 5) of the plurality of wirings 202 of the side of the second wiring board 210, a plurality of first connection terminals 204*b* is formed on the upper surface of the same flexible film 201. The first connection terminals 204*b* are an example of "other-side first connection terminal" of the invention and are electrically connected to connection terminals 214*a* of the second wiring board 210 via, for example, an ACF (not shown) In addition, the driving IC chip 300 is COF-mounted on the upper surface of the flexible film 201 and is electrically connected to the wirings 202.

In the second wiring board 210, the plurality of wirings 212 is formed on the lower surface of a flexible film 211. At front ends (that is, the left ends in FIGS. 4 and 5) of the plurality of wirings 212 of the side of the first wiring board 200, a plurality of second connection terminals 214*a* is formed on the lower surface of the same flexible film 211. The second connection terminals 214*a* are an example of "one-side second connection terminal" of the invention and are electrically connected to the first connection terminals 204*b* via, for example, an ACF (not shown). At front ends (that is, the right ends in FIGS. 4 and 5) of the plurality of wirings 212 of the connected side of the external connector, a plurality of second connection terminals 214*b* is formed on the lower surface of the same flexible film 211. The second connection terminals 214*b* are an example of "other-side second connection terminal" of the invention and are electrically connected to the external connector when the liquid crystal device 1 is mounted in various types of electronic apparatuses.

The first wiring board 200 and the second wiring board 210 are respectively formed by patterning the wirings 202 and 212 on, for example, a base material such as polyimide. The flexible film 201 is preferably formed of a relatively thin single-layer film material such that the connection place with the liquid crystal panel 100 is not broken by heat stress. In contrast, the flexible film 211 is preferably formed of a relatively thick multi-layer film material so as not to be damaged due to bending at the time of the connection with the external connector or the mounting of the liquid crystal device 1.

As shown in FIG. 5, the liquid crystal panel 100, the first wiring board 200 and the second wiring board 210 are connected to each other by compression bond or thermal compression bond in a pressurization direction denoted by arrows of FIG. 5 during manufacturing.

As shown in FIG. 6, the liquid crystal device 1 completed as shown in FIG. 4 is electrically and mechanically connected to the external connector 500 at the second connection terminals 214*b* located on the front end of the second wiring board 210 when being mounted in various types of electronic apparatuses. At this time, the second wiring board 210 may be bent as shown. In contrast, it is preferable that the first wiring board 200 is not bent. In particular, as can be seen from FIG. 6, as the connector 500, a lower contact connector, a lower contact or a lower contact type connector is used.

By this configuration, at the time of the operation of the liquid crystal device 100, various types of signals such as external serial image signals or power signals are input via the connector 500 and the second connection terminals 214*b*. Furthermore, various types of signals are output from the second connection terminals 214*a* via the wirings 212 connected to the second connection terminals 214*b* to the first wiring board 200. Then, on the first wiring board 200, various types of signals are input to the driving IC chip 300 via the first connection terminals 204*b* connected to the second connection terminals 214*a* and the wirings 202. Then, various types of signals obtained by processes such as a serial-parallel conversion (that is, a phase development or a serial-parallel development) executed by the driving IC chip 300 are input to the external circuit connection terminals 102 via the wirings 202 and the first connection terminals 204*a*. That is, various types of signals such as a parallel image signal and a power signal are input to the liquid crystal panel 100.

In the present embodiment, in particular, the wiring forming surface of the first wiring board 200 is connected to the liquid crystal panel 100 so as to face the surface of the TFT array substrate 10. Accordingly, all the first connection terminals 204*a*, the wirings 202, the driving IC chip 300 and the first connection terminals 204*b* are directed in the opposite vertical direction (that is, the vertical opposite direction in FIGS. 4 to 6) of the surface of the TFT array substrate 10. The wiring forming surface of the second wiring board 210 is connected to the first wiring board 200 so as to face the surface of the wiring forming surface of the first wiring board 200. Accordingly, all the second connection terminals 214*a*, the wirings 212 and the second connection terminals 214*b* are directed in the same vertical direction (that is, the same vertical direction in FIGS. 4 to 6) of the surface of the TFT array substrate 10.

Accordingly, with respect to the connection of the second connection terminals 214*b* and the connector 500 corresponding to the input/output terminal with the external connector 500 (see FIG. 6), a lower contact connector method having high versatility and a relatively easy mounting property may be used. In other words, with respect to the upper and lower sides of the input/output terminals with the external connector 500 in the whole liquid crystal device 1, a connection environment with high reliability can be easily obtained by the direct connection of the connector 500 to the external circuit connection terminal 102 on the liquid crystal panel 100.

In addition, as shown in FIG. 6, the liquid crystal device 1 and the external connector are connected by the handling of the side of the second wiring board 210 which is located far from the liquid crystal panel 100. Accordingly, as the first wiring board 200, a configuration which is hard to be handled at the time of connection and is susceptible to be damaged may be employed. That is, a COF-mounted flexible board which is susceptible to be damaged at the time of connection or mounting and has high cost may be used as the first wiring board 200 and a non-COF-mounted flexible board which is hard to be damaged at the time of connection or mounting and has low cost may be used as the second wiring board 210. Accordingly, the advanced signal processing function is performed by the first wiring board 200 and the handling at the time of mounting of the liquid crystal device 1 is performed by the second wiring board 210.

In particular, with respect to the first wiring board 200, a thin single-layer base material may be used because the mechanical strength is not required. Accordingly, it is possible to avoid breaking or defect in the vicinity of the connection place due to a difference in thermal expansion coefficient with the TFT array substrate 10. In contrast, with respect to the second wiring board 210, a hard multi-layer base material may be used. Accordingly, it is possible to reduce breaking due to bending or tension at the time of mounting or connection to the connector 500.

As shown in FIG. 7, in the present embodiment, preferably, on the first wiring board 200, a wiring pitch P1 of the wirings 202*a* (that is, an arrangement pitch of the first connection terminals 204*a*) corresponding to the output side of the driving IC chip 300 is smaller than a wiring pitch P2 of the wirings 202*b* (that is, an arrangement pitch of the first connection terminals 204*b*) corresponding to the input side of the driving IC chip 300. Accordingly, it is possible to easily cope with the fineness of a pixel pitch of the liquid crystal panel 100 or a terminal pitch of the external circuit connection terminal 102 corresponding thereof by the fine arrangement pitch P1. Simultaneously, it is possible to easily cope with a relatively large wiring pitch or a terminal pitch of the side of the second wiring board 210 by the coarse arrangement pitch P2. In particular, since the serial-parallel conversion is performed, the number of signals output from the driving IC chip 300 is significantly larger than the number of signals input to the driving IC chip 300. Accordingly, as shown in FIG. 7, if the arrangement pitch is changed in the input side and the output side, it is advantageous that a space is efficiently used on the wiring layout. In addition, the width of the wirings 202*b* of the input side can be larger than that of the wirings 202*a* of the output side.

In addition, as shown in FIG. 7, wirings 202*c* passing through the driving IC chip 300 may be provided. Such wirings 202*c* do not require, for example, the processing of the driving IC chip 300, and directly supply signals which should be supplied to the liquid crystal panel 100.

As described above, by placing the first wiring board 200 and the second wiring board 210 in series between the liquid crystal panel 100 and the connector 500 and utilizing a specific connection relationship therebetween, various advantageous effects can be obtained.

Second Embodiment

Figure 8:
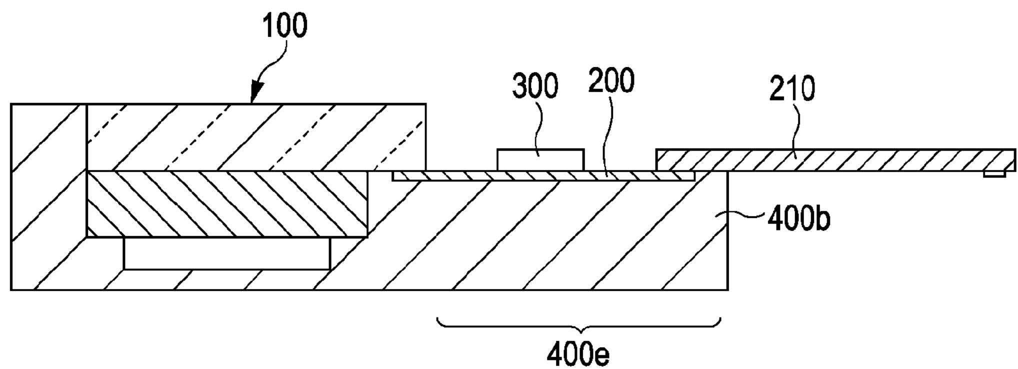
FIG. 8 is a schematic cross-sectional view of a liquid crystal device according to the second embodiment.
Figure 9:
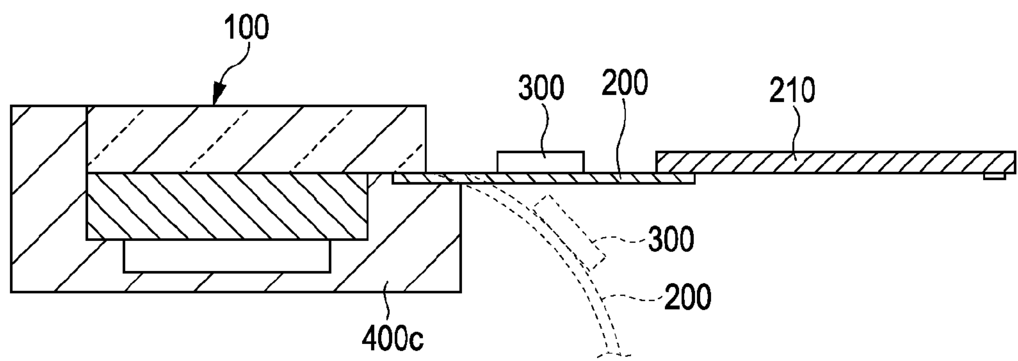
FIG. 9 is a schematic cross-sectional view of a liquid crystal device according to a comparative example of the second embodiment.

A second embodiment of the invention will be described with reference to FIGS. 8 and 9. FIG. 8 is a schematic cross-sectional view equal to FIG. 4 according to the second embodiment and FIG. 9 is a schematic cross-sectional view of a comparative example thereof. In addition, in FIGS. 8 and 9, the same components as the first embodiment shown in FIGS. 1 to 4 will be denoted by the same reference numerals and the description thereof will be properly omitted.

In FIG. 8, the liquid crystal panel 100 is contained in a case 400*b* extending along the back side (that is, the lower side of FIG. 8) of the first wiring board 200. The first wiring board 200 is mounted on an extension 400*e* of the case 400*b* as an example of a "reinforcement member" of the invention. That is, the first wiring board 200 is reinforced by the extension 400*e*. The extension 400*e* extends to the connection place between the first wiring board 200 and the second wiring board 210 and is adhered to the lower surface of the second wiring board 210 by an adhesive. In addition, as a material of the case 400*b*, any one of metal, resin and ceramic may be used. The other configuration is equal to that of the above-described first embodiment.

By this configuration, the mechanical or physical strength of the first wiring board 200 can be remarkably improved due to the existence of the extension 400*e*. In particular, as described above, since a material which is thin and is susceptible to be damaged is suitably employed as the flexible film configuring the base material of the first wiring board 200, the reinforcement is highly advantageous.

As shown in FIG. 9, if the extension 400*e* does not exist like the case 400*c*, when bending is performed at the time of mounting, instead of the second wiring board 210 or together with the second wiring board 210, the first wiring board 200 may be bent upward or downward and may be damaged. In addition, by carefully performing a mounting operation, it is possible avoid the bending of the first wiring board 200 as shown in FIG. 9.

However, in the second embodiment, during the mounting operation or before the mounting operation, as shown in FIG. 9, since the possibility that the first wiring board 200 is bent can substantially become zero, a practical advantage is obtained. In addition, compared with the case where the reinforcement member is separately mounted, the manufacturing process and the configuration of the apparatus do not become complicated.

In particular, since the front end of the extension 400*e* extends to the connection place between the first wiring board 200 and the second wiring board 210 and adheres thereto, the whole area of the first wiring board 200 can be reinforced with certainty and the mechanical or physical strength of the vicinity of the connection place can be efficiently improved. At this time, unless the adhesion is released, the first wiring board 200 is not bent upward so as to be rolled up on the extension 400*e*. Simultaneously, the bending operation of the substrate at the side of the second wiring board 210 at the time of mounting shown in FIG. 6 in the first embodiment can be performed without causing a problem and the extension 400*e* does not become a hindrance to the mounting operation.

Third Embodiment

Figure 10:
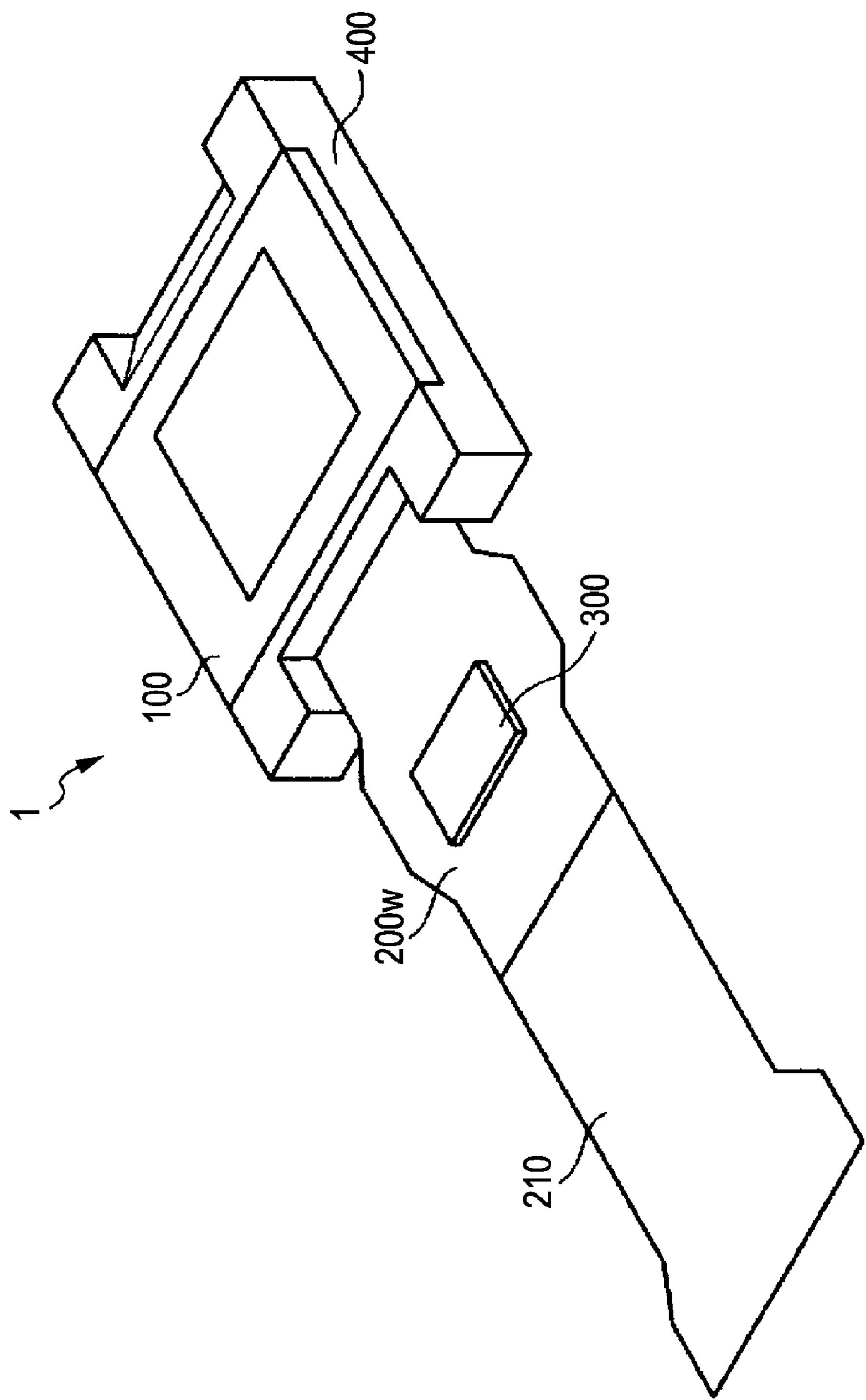
FIG. 10 is a perspective view of a liquid crystal device according to a third embodiment of the invention.
Figure 11:
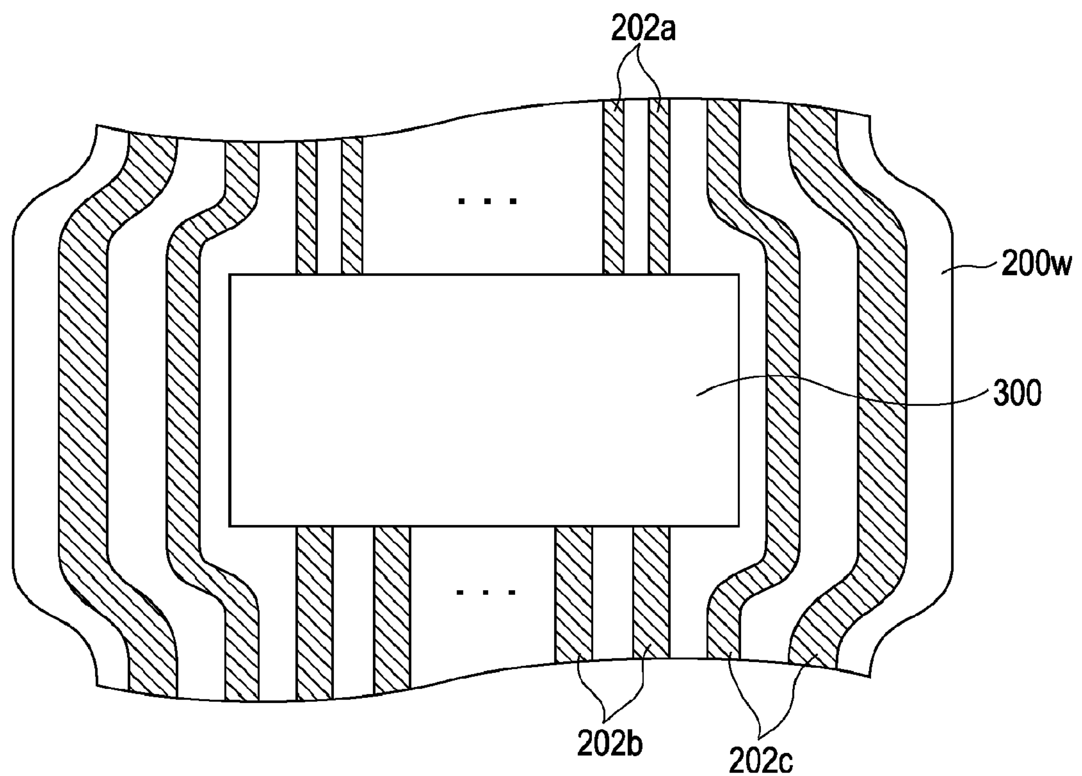
FIG. 11 is a plan view of a first wiring board used in a third embodiment of the invention in the vicinity of a COF-mounted place.
Figure 12:
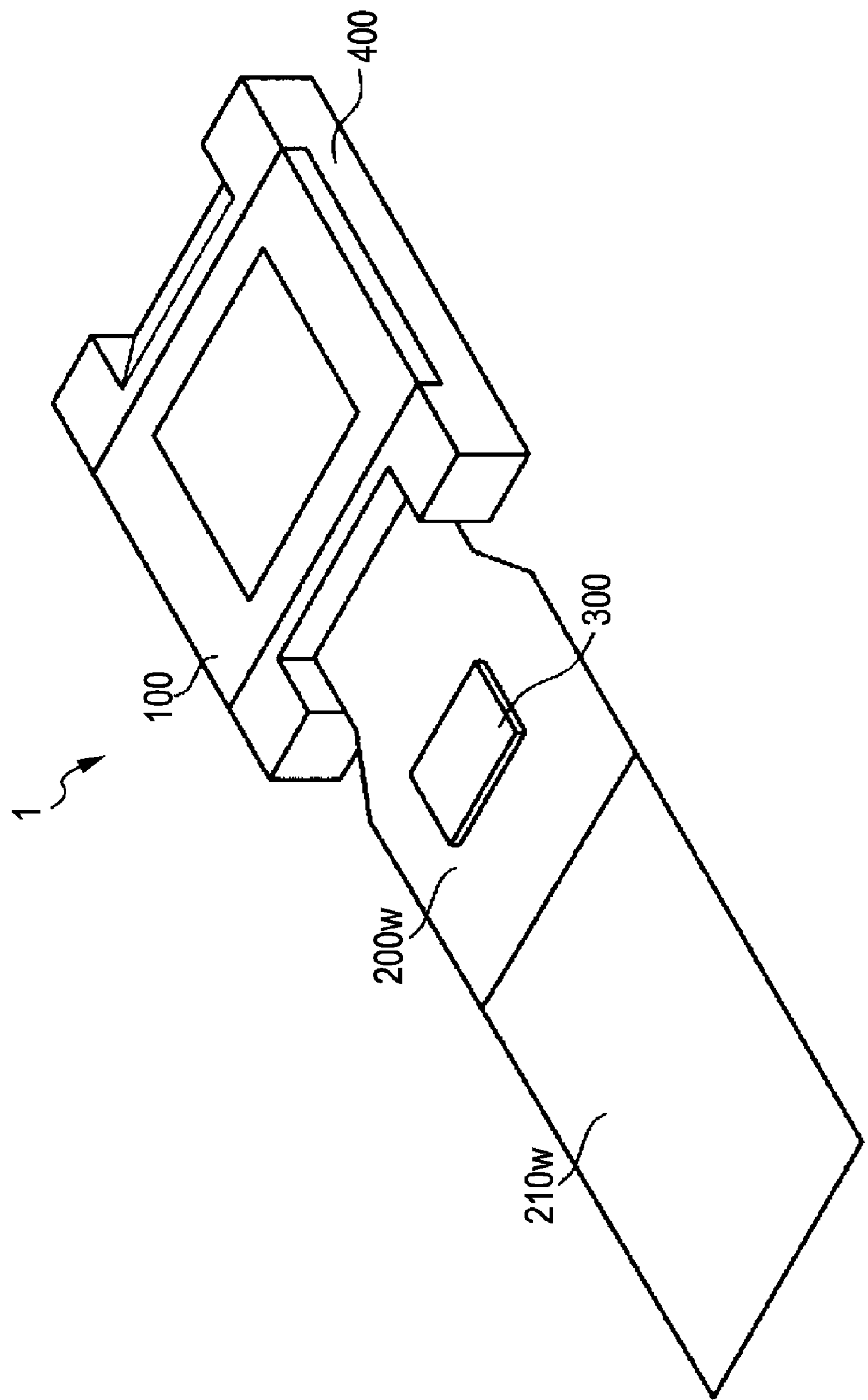
FIG. 12 is a perspective view of a liquid crystal device according to a modified example of the third embodiment.
Figure 13:
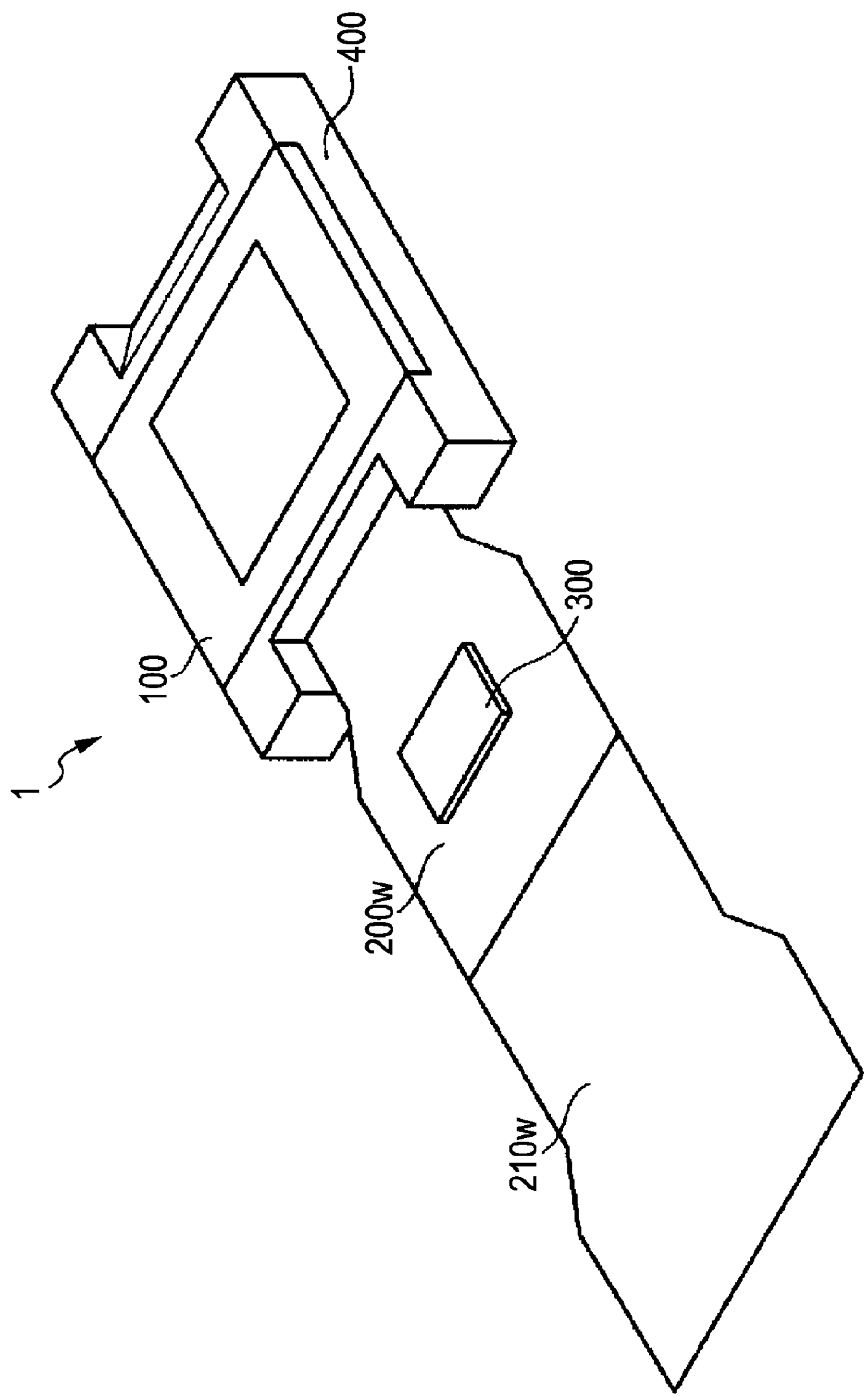
FIG. 13 is a perspective view of a liquid crystal device according to another modified example of the third embodiment.

A third embodiment of the invention will be described with reference to FIGS. 10 to 13. FIG. 10 shows the same outer appearance as FIG. 1 of the liquid crystal device according to the third embodiment and FIG. 11 is a plan view of the first wiring board in the vicinity of the COF-mounted place. FIGS. 12 and 13 show the outer appearance according to modified examples of the third embodiment. In FIGS. 10 to 13, the same components as the first embodiment shown in FIGS. 1 to 4 are denoted by the same reference numerals and the description thereof will be properly omitted.

In FIGS. 10 and 11, a first wiring board 200W is locally widely formed in the vicinity of a place where the driving IC chip 300 is mounted. A large-width portion is wired such that the wiring 202*c* detour the driving IC chip 300. The other configuration is equal to that of the first embodiment.

By this configuration, although the driving IC chip 300 having a large width is mounted on the first wiring board 200, the width of the connection portion between the first wiring board 200 and the liquid crystal panel 100 can be reduced so as to correspond to the size of the TFT array substrate configuring the liquid crystal panel 100 or the length of the side in which the external circuit connection terminal is arranged. Further, the width of the connection portion between the first wiring board 200 and the second wiring board 210 reaching the external connector can be reduced. In addition, by detouring the wirings 202*c* which do not need to pass through the inside of the driving IC chip 300 using the large-width portion of the first wiring board 200W, the wirings can be wired on the liquid crystal panel 100 without causing a problem.

As shown in FIG. 12, as a modified example of the third embodiment, in the first wiring board 200W, the large width is maintained at the side of the liquid crystal panel 100 after the width widens. Thus, a second wiring board 210W wholly has a large width. By this configuration, the width of the connection portion between the first wiring board 200 and the liquid crystal panel 100 can be reduced so as to correspond to the size of the TFT array substrate configuring the liquid crystal panel 100. Simultaneously, with respect to a path from the external connector to the driving IC chip 300, a wiring pitch is large or each wiring is thick and all wirings can be established as wirings with high reliability and hardness.

As shown in FIG. 13, as another modified example of the third embodiment, in the first wiring board 200W, the large width is maintained at the side of the liquid crystal panel 100 after the width widens. Further, the width of the second wiring board 210W is increased midway toward the external connector. By this configuration, with respect to the wirings in the vicinity of the connection portion with the external connector and the connection portion, the terminal pitch or the wiring pitch is large or each terminal or each wiring is thick and the connection place with high reliability and hardness can be established.

Electronic Apparatus

Figure 14:
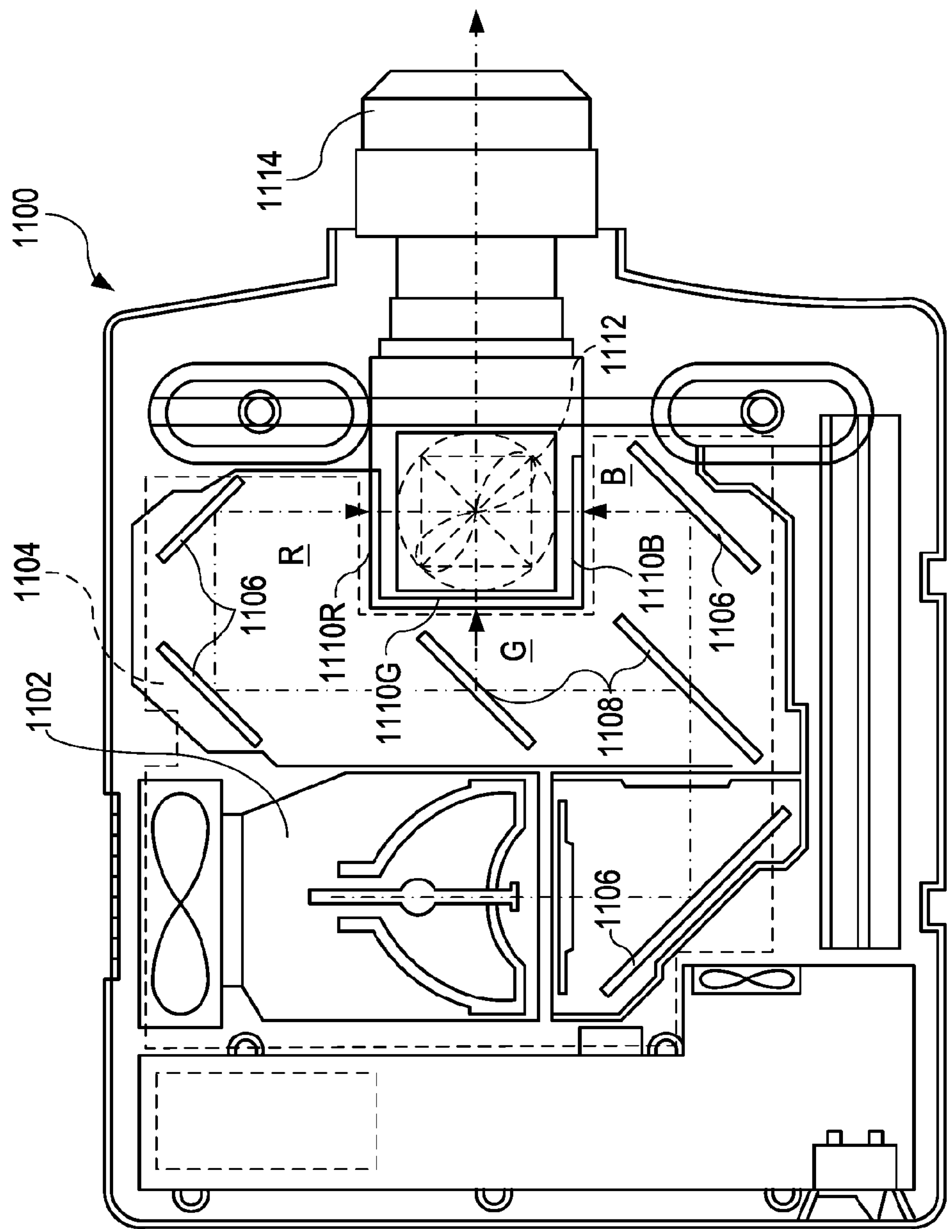
FIG. 14 is a plan view showing the configuration of a projector which is an example of an electronic apparatus including the liquid crystal device according to the embodiment of the invention.

Next, a projector, which is an example of an electronic apparatus including the above-described electro-optical device, will be described with reference to FIG. 14. The liquid crystal panel 100 of the above-described liquid crystal device 1 is used as a light valve of the projector. FIG. 14 is a plan view showing a configuration example of the projector.

As shown in FIG. 14, a lamp unit 1102 composed of a white light source such as a halogen lamp or the like is provided inside the projector 1100. An incident light emitted from the lamp unit 1102 is separated into three primary colors of R, G, and B by four mirrors 1106 and two dichroic mirrors 1108 disposed inside a light guide 1104 and the three primary colors are respectively incident to liquid crystal panels 110R, 110G, and 110B as the light valves corresponding to the primary colors.

The liquid crystal panels 110R, 110G, and 110B have the same configuration as the above-described liquid crystal device and are driven by the primary signals of R, G, and B supplied from the image signal processing circuit. The light modulated by the liquid crystal panel is made incident into a dichroic prism 1112 from three directions. In the dichroic prism 1112, the light of R and B is refracted at an angle of 90 degrees and the light of G goes straight. Therefore, an image of each color is synthesized, whereby a color image is projected onto a screen or the like through a projector lens 1114.

Here, when attention is focused on a display image by each of the liquid crystal panels 110R, 110G, and 110B, the display images by the liquid crystal panels 110R and 110B is needed to be mirror-inversed with respect to the display image by the liquid crystal panel 110G.

Further, since light corresponding to each of the primary colors of R, G, and B is incident to each of the liquid crystal panels 110R, 110G, and 110B by the dichroic mirrors 1108, there is no need to provide a color filter.

In addition to the electronic apparatus described with reference to FIG. 14, there are a mobile personal computer, a cellular phone, a liquid crystal television set, a viewfinder-type or direct-view monitor type video tape recorder, a car navigation system, a pager, an electronic organizer, an electronic calculator, a word processor, a workstation, a videophone, a POS terminal, and a touch-panel-equipped device. The invention is applicable to such electronic apparatuses.

In addition, the invention is not limited to the above-described embodiments and may be properly modified without departing from the scope or spirit of the invention which can be read from the whole specification and claims. An electro-optical device including such a modification and an electronic apparatus including the electro-optical device are included in the technical range of the invention.

What is claimed is:

1. An electro-optical device comprising:

an electro-optical panel having a pair of substrates, a liquid crystal layer disposed between the pair of substrates, a scan line driving circuit, a sampling circuit, and a panel-side external connection terminal for inputting/outputting signals from an external device to the electro-optical panel for electro-optical operations;

a first wiring board having a first wiring forming surface, the first wiring forming surface being formed with wirings, a one-side first connection terminal electrically connected to the panel-side external connection terminal at one end of the first wiring forming surface and an other-side first connection terminal at the other end of the first wiring forming surface;

a second wiring board having a second wiring forming surface, the second wiring forming surface being formed with wirings, a one-side second connection terminal electrically connected to the other-side first connection terminal at one end of the second wiring forming surface and an other-side second connection terminal at the other end of the second wiring forming surface for electrically connecting to an external connector of the external device; and a case for containing the electro-optical panel, the case being fixed to at least a part of a substrate surface of one of the pair of substrates, the substrate surface facing away from the other of the pair of substrates, the case having a plate-shaped reinforcement member, wherein:

the plate-shaped reinforcement member is mounted on a back surface of the first wiring board, the back surface being located opposite the first wiring forming surface, such that the plate-shaped reinforcement member reinforces the first wiring board from the back surface, the plate-shaped reinforcement member extends from the electro-optical panel to a position directly facing the second wiring forming surface of the second wiring board, the portion of the plate-shaped reinforcement member directly facing the second wiring forming surface being directly adhered by an adhesive to the second wiring forming surface, and the second wiring board is a flexible board having an unreinforced region that is not adjacent to the plate-shaped reinforcement member, the unreinforced region extending between the portion of the second wiring forming surface that is adhered to the plate-shaped reinforcement member and the other-side second connection terminal.

2. The electro-optical device according to claim 1, wherein the first wiring board has an integrated circuit of which an output side is electrically connected to the one-side first connection terminal and an input side is electrically connected to the other-side first connection terminal.

3. The electro-optical device according to claim 2, wherein an arrangement pitch of the one-side first connection terminal is smaller than that of the other-side first connection terminal.

4. The electro-optical device according to claim 2, wherein the integrated circuit serial-parallel converts a serial image signal input via the other-side first connection terminal and outputs a parallel image signal via the one-side first connection terminal.

5. The electro-optical device according to claim 2, wherein the first wiring board is a flexible board in which the integrated circuit is COF-mounted, and the second wiring board is a flexible board in which the integrated circuit is not COF-mounted.

6. The electro-optical device according to claim 2, wherein a long side of the integrated circuit is formed on the first wiring forming surface in plan view along a width direction of the first wiring board, the first wiring board is locally widely formed in a portion in which the integrated circuit is mounted, and wirings formed in the first wiring forming surface include wirings which are formed so as to detour the integrated circuit.

7. The electro-optical device according to claim 1, wherein the width of one end of the first wiring board is narrower than that of the other end thereof.

8. The electro-optical device according to claim 1, wherein the reinforcement member includes a plate-shaped portion obtained by extending a portion of a case for containing the electro-optical panel toward the second wiring board.

9. The electro-optical device according to claim 1, wherein the reinforcement member is adhered to the second wiring forming surface.

10. An electronic apparatus comprising the electro-optical device according to claim 1.

11. An electro-optical device comprising:

an electro-optical panel having a first substrate, a second substrate that extends from the first substrate, a liquid crystal layer disposed between the first substrate and the second substrate, and a first connection terminal on the first substrate side of the second substrate;

a first wiring board having a first surface formed with a first wiring, a second connection terminal that is electrically connected to the first connection terminal and the first wiring at one end of the first surface, a third connection terminal that is electrically connected to the first wiring at other end of the first surface, and a driving IC chip between the second connection terminal and the third connection terminal on the first surface;

a second wiring board having a second surface formed with a second wiring, a fourth connection terminal that is electrically connected to the third connection terminal and the second wiring at one end of the second surface, and a fifth connection terminal that is electrically connected to the second wiring and an external connector of an external device; and a case for containing the electro-optical panel, the case being fixed to at least a part of a substrate surface of the first substrate of the electro-optical panel, the substrate surface facing away from the second substrate of the electro-optical panel, the case having a reinforcement member that extends from the electro-optical panel, wherein:

a third surface of the first wiring board is mounted on the reinforcement member, the third surface being located opposite the first surface, such that the reinforcement member reinforces the first wiring board from the third surface, the reinforcement member has a portion that directly faces the second surface of the second wiring board, the portion of the reinforcement member being directly adhered by an adhesive to the second surface, and the second wiring board is a flexible board having an unreinforced portion that is not adjacent to the reinforcement member, the unreinforced portion extending between the portion of the reinforcement member and the fifth connection terminal.

12. The electro-optical device according to claim 1, wherein the first wiring board is a single-layer film material, wherein the second wiring board is a multi-layer film material, and wherein the second wiring board is thicker than the first wiring board.

13. The electro-optical device according to claim 2, wherein a material of the case is metal.

* * * * *